(12) United States Patent
Chao et al.

(10) Patent No.: US 10,796,924 B2
(45) Date of Patent: Oct. 6, 2020

(54) SEMICONDUCTOR DEVICE AND MANUFACTURING METHOD THEREOF BY FORMING THIN UNIFORM SILICIDE ON EPITAXIAL SOURCE/DRAIN STRUCTURE

(71) Applicant: TAIWAN SEMICONDUCTOR MANUFACTURING CO., LTD., Hsinchu (TW)

(72) Inventors: Yuan-Shun Chao, Zhubei (TW); Chih-Wei Kuo, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/382,921

(22) Filed: Dec. 19, 2016

(65) Prior Publication Data

US 2017/0243760 A1    Aug. 24, 2017

Related U.S. Application Data

(60) Provisional application No. 62/296,957, filed on Feb. 18, 2016.

(51) Int. Cl.
*H01L 29/78* (2006.01)
*H01L 21/44* (2006.01)
(Continued)

(52) U.S. Cl.
CPC ........ *H01L 21/44* (2013.01); *H01L 21/28518* (2013.01); *H01L 29/0847* (2013.01); *H01L 29/26* (2013.01); *H01L 29/41791* (2013.01); *H01L 29/45* (2013.01); *H01L 29/66795* (2013.01); *H01L 29/66969* (2013.01);
(Continued)

(58) Field of Classification Search
CPC ............. H01L 29/785; H01L 29/66969; H01L 29/0847; H01L 29/26; H01L 21/823418; H01L 21/823814; H01L 21/44; H01L 29/66795; H01L 29/7848; H01L 29/41791;
(Continued)

(56) References Cited

U.S. PATENT DOCUMENTS 6,399,487 B1 * 6/2002 Lai ................... H01L 21/28052
257/E21.165
6,486,062 B1   11/2002 Kluth et al.
(Continued)

FOREIGN PATENT DOCUMENTS

CN    103426768 A    12/2013
CN    106920776 A    7/2017

OTHER PUBLICATIONS

Taiwanese Office Action issued in corresponding Taiwanese Application No. 106105427, dated Feb. 5, 2018.
(Continued)

*Primary Examiner* — Bitew A Dinke
(74) *Attorney, Agent, or Firm* — McDermott Will & Emery LLP

(57) ABSTRACT

In a method of manufacturing a semiconductor device, a first layer containing a $Si_{1-x}Ge_x$ layer doped with phosphorous is formed over an n-type semiconductor layer, a metal layer containing a metal material is formed over the first layer, and a thermal process is performed to form an alloy layer including Si, Ge and the metal material.

18 Claims, 13 Drawing Sheets

(51) Int. Cl.
  *H01L 29/417*  (2006.01)
  *H01L 29/66*  (2006.01)
  *H01L 21/285*  (2006.01)
  *H01L 29/08*  (2006.01)
  *H01L 29/26*  (2006.01)
  *H01L 29/45*  (2006.01)

(52) U.S. Cl.
  CPC ........ *H01L 29/785* (2013.01); *H01L 29/7848* (2013.01); *H01L 2029/7858* (2013.01)

(58) Field of Classification Search
  CPC ............... H01L 21/28518; H01L 29/45; H01L 2029/7858
  See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 9,472,628 B2 | 10/2016 | Cheng et al. | |
| 9,614,084 B1* | 4/2017 | Kim | H01L 21/02499 |
| 9,870,926 B1* | 1/2018 | Huang | H01L 29/41791 |
| 9,947,756 B2* | 4/2018 | Li | H01L 29/7848 |
| 9,991,257 B2* | 6/2018 | Park | H01L 27/0886 |
| 2006/0128125 A1* | 6/2006 | Mangelinck | H01L 21/28061 |
| | | | 438/483 |
| 2011/0073952 A1* | 3/2011 | Kwok | H01L 29/045 |
| | | | 257/368 |
| 2011/0147828 A1* | 6/2011 | Murthy | H01L 21/02057 |
| | | | 257/327 |
| 2011/0256681 A1* | 10/2011 | Lin | H01L 29/665 |
| | | | 438/285 |
| 2012/0068193 A1* | 3/2012 | Chan | H01L 21/26506 |
| | | | 257/77 |
| 2012/0171834 A1* | 7/2012 | Tamura | H01L 21/26506 |
| | | | 438/305 |
| 2012/0319211 A1 | 12/2012 | van Dal et al. | |
| 2013/0011983 A1 | 1/2013 | Tsai et al. | |
| 2013/0049068 A1* | 2/2013 | Lin | H01L 29/7853 |
| | | | 257/192 |
| 2013/0277769 A1* | 10/2013 | Tung | H01L 29/41791 |
| | | | 257/412 |
| 2013/0316509 A1* | 11/2013 | Qin | H01L 29/6653 |
| | | | 438/289 |
| 2014/0042500 A1* | 2/2014 | Wann | H01L 29/41791 |
| | | | 257/288 |
| 2014/0048888 A1* | 2/2014 | Chen | H01L 21/02664 |
| | | | 257/369 |
| 2014/0065782 A1* | 3/2014 | Lu | H01L 29/785 |
| | | | 438/294 |
| 2014/0087537 A1* | 3/2014 | Kim | H01L 29/66477 |
| | | | 438/301 |
| 2014/0124904 A1* | 5/2014 | Liao | H01L 21/0237 |
| | | | 257/655 |
| 2014/0159052 A1* | 6/2014 | Liu | H01L 29/6659 |
| | | | 257/77 |
| 2014/0264590 A1* | 9/2014 | Yu | H01L 29/66795 |
| | | | 257/344 |
| 2014/0282326 A1 | 9/2014 | Chen et al. | |
| 2014/0357040 A1* | 12/2014 | Loubet | H01L 29/66795 |
| | | | 438/299 |
| 2015/0021688 A1* | 1/2015 | Sung | H01L 21/823412 |
| | | | 257/344 |
| 2015/0097197 A1* | 4/2015 | Ganz | H01L 29/785 |
| | | | 257/77 |
| 2015/0200271 A1* | 7/2015 | Lee | H01L 29/66795 |
| | | | 257/401 |
| 2015/0303118 A1* | 10/2015 | Wang | H01L 21/823481 |
| | | | 257/401 |
| 2015/0340471 A1 | 11/2015 | Lim et al. | |
| 2016/0005866 A1* | 1/2016 | Wu | H01L 29/7851 |
| | | | 257/401 |
| 2016/0013316 A1* | 1/2016 | Kuang | H01L 21/0243 |
| | | | 257/190 |
| 2016/0079367 A1* | 3/2016 | Yoo | H01L 29/785 |
| | | | 257/77 |
| 2016/0104787 A1* | 4/2016 | Kittl | H01L 29/665 |
| | | | 438/283 |
| 2016/0111537 A1* | 4/2016 | Tsai | H01L 29/7848 |
| | | | 257/192 |
| 2016/0126343 A1* | 5/2016 | Ching | H01L 29/785 |
| | | | 257/192 |
| 2016/0155837 A1* | 6/2016 | Lee | H01L 29/1608 |
| | | | 257/288 |
| 2016/0211371 A1* | 7/2016 | Tsai | H01L 29/7848 |
| 2016/0254351 A1* | 9/2016 | Tsai | H01L 29/0847 |
| | | | 257/77 |
| 2016/0268171 A1* | 9/2016 | Wei | H01L 21/823807 |
| 2016/0268257 A1* | 9/2016 | Lim | H01L 27/0886 |
| 2016/0276436 A1* | 9/2016 | Pan | H01L 29/0847 |
| 2016/0293750 A1* | 10/2016 | Kim | H01L 29/7848 |
| 2016/0308004 A1* | 10/2016 | Lee | H01L 29/0847 |
| 2016/0336319 A1* | 11/2016 | Yang | H01L 27/0924 |
| 2016/0365451 A1* | 12/2016 | Zang | H01L 29/785 |
| 2017/0117379 A1* | 4/2017 | Chen | H01L 29/665 |
| 2017/0154979 A1* | 6/2017 | Lo | H01L 29/66795 |
| 2017/0154996 A1* | 6/2017 | Lin | H01L 21/02057 |
| 2017/0162671 A1* | 6/2017 | Basker | H01L 29/66636 |
| 2017/0186654 A1* | 6/2017 | Li | H01L 21/823814 |
| 2017/0194212 A1* | 7/2017 | Hung | H01L 29/165 |
| 2017/0207095 A1* | 7/2017 | Lee | H01L 21/28518 |
| 2017/0221892 A1* | 8/2017 | Li | H01L 21/324 |
| 2017/0229578 A1* | 8/2017 | Pandey | H01L 29/0847 |
| 2018/0350625 A1* | 12/2018 | Chao | H01L 29/41791 |

OTHER PUBLICATIONS

Kojima, J., et al., "Interfacial Reactions and Electrical Characteristics in Ti/SiGe/Si(100) Contact Systems", Applied Surface Science 117/118 (1997), pp. 317-320.

Non-final Office Action issued in related U.S. Appl. No. 16/049,138, dated Jun. 27, 2019.

* cited by examiner

US 10,796,924 B2

SEMICONDUCTOR DEVICE AND MANUFACTURING METHOD THEREOF BY FORMING THIN UNIFORM SILICIDE ON EPITAXIAL SOURCE/DRAIN STRUCTURE

CROSS-REFERENCE TO RELATED APPLICATIONS

This application claims priority to U.S. Provisional Patent Application 62/296,957 filed Feb. 18, 2016, the entire disclosure of which is incorporated herein by reference.

TECHNICAL FIELD

The disclosure relates to a semiconductor integrated circuit, and more particularly to a semiconductor device having a uniform and thin silicide layer on an epitaxial source/drain (S/D) structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method. Further, a silicide layer is formed on the sources and drains.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

Figure 1A:
FIGS. 1A-1C show an exemplary sequential process flow according to one embodiment of the present disclosure.
Figure 1B:
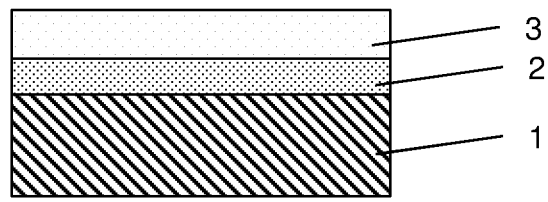
Figure 1C:
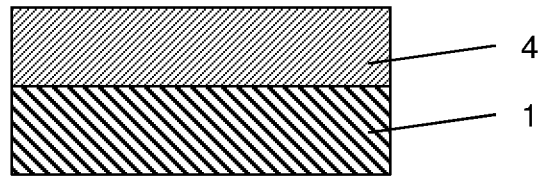

FIGS. 1A-1C show exemplary sequential process flow for forming a silicide layer according to one embodiment of the present disclosure.

As shown in FIG. 1A, a first layer 2 containing $Si_{1-x}Ge_x$ doped with phosphorous (P) (hereinafter referred to as SiGe:P) is formed by an epitaxial deposition process over an n-type semiconductor layer 1. The n-type semiconductor layer 1 includes heavily doped n-type Si based semiconductor materials. The n-type semiconductor layer 1 includes SiP or SiCP. In this embodiment, SiP is used.

An amount of P in the SiP layer is in a range from about $1\times10^{20}$ cm$^{-3}$ to about $5\times10^{21}$ cm$^{-3}$ in some embodiments. In certain embodiments, the SiP layer includes two or more SiP layers with different P amounts.

The fraction x of Ge in the SiGe:P first layer 2 is in a range from about 0.25 to about 0.50 in some embodiments, and is in a range from about 0.30 to about 0.40 in other embodiments. An amount of phosphorous in the SiGe:P first layer 2 is in a range from about $1\times10^{20}$ cm$^{-3}$ to about $5\times10^{21}$ cm$^{-3}$ in some embodiments, and in a range from about $5\times10^{20}$ cm$^{-3}$ to about $1\times10^{21}$ cm$^{-3}$ in other embodiments.

The thickness of the first SiGe:P layer 2 is in a range from about 1 nm to about 20 nm in some embodiments, and is in a range from about 5 nm to about 10 nm in other embodiments.

The first SiGe:P layer is epitaxially formed and thus has a crystal structure. In certain embodiments, the first SiGe:P layer has a polycrystalline or an amorphous structure.

Then, as shown in FIG. 1B, a second layer 3 containing a metal material is formed over the first SiGe layer 2. The metal material for the second layer 3 is at least one of Ti, Co, Ni, W or Ta. In one embodiment, Ti is used for the second layer 3. Two or more layers of metal material may be used for the second layer 3. The thickness of the second layer 3 is in a range from about 1 nm to about 15 nm in some embodiments, and is in a range from about 3 nm to about 10 nm in other embodiments.

In some embodiments, a cleaning operation is performed on the first SiGe layer 2 before forming the second layer 3. The cleaning operation includes wet cleaning using dilute HF (DHF) and/or buffered HF (BHF). An in-situ cleaning using a gas or plasma ($NF_3$ and/or $NH_3$) in a chamber for forming the second layer may be employed as the cleaning operation.

The second layer 3 is formed by, for example, chemical vapor deposition (CVD), physical vapor deposition (PVD)

including sputtering, atomic layer deposition (ALD) or other suitable film formation methods.

After the second layer is formed, a thermal process, i.e., annealing, is performed to form an alloy layer of the SiGe:P first material and the metal material of the second layer 3.

When the metal material of the second layer 3 is Ti, for example, a Ti(SiGe)$_2$ layer 4 is formed.

The annealing operation is performed at a temperature from about 500° C. to about 1100° C. in some embodiments. In certain embodiments, the annealing is performed at a temperature in a range from about 700° C. to about 1000° C. for a time period from about 10 sec to about 200 sec. In other embodiments, the annealing is performed at a temperature in a range from about 800° C. to about 1100° C. for a time period from about 1 μsec to about 1 sec. In other embodiments, the annealing period is in the millisecond range, for example, in a range from about 1 msec to about 100 msec. The annealing operation is performed in an inert gas ambient.

The thickness of the silicide-germanide (alloy) layer 4 is in a range from about 1 nm to about 10 nm in some embodiments, and is in a range from about 3 nm to about 5 nm in other embodiments.

By the annealing operation, the first SiGe:P layer 2 is substantially completely consumed to form the alloy layer 4 in some embodiments. In other embodiments, only a part of the first SiGe:P layer 2 is consumed to form the alloy layer 4 and the lower layer of the first SiGe:P layer 2 remains between the alloy layer 4 and the substrate layer 1.

By using a SiGe:P layer when forming an alloy layer of Ti, a Schottky barrier height (SBH) between the n-type SiP layer and the TiSiGe layer can be reduced, thereby reducing the contact resistivity by about 70% compared with TiSi (titanium silicide).

FIGS. 2-16 show exemplary cross sectional views of various stages for manufacturing a Fin FET device according to one embodiment of the present disclosure. It is understood that additional operations can be provided before, during, and after the processes shown by FIGS. 2-16, and some of the operations described below can be replaced or eliminated, for additional embodiments of the method. The order of the operations/processes may be interchangeable. Further, the configurations, structures, operations and/or materials used for FIGS. 1A-1C may be applied to the manufacturing processes shown by FIGS. 2-16, and the detailed description may be omitted.

To fabricate fin structures for the Fin FET device, a mask layer 15 is formed over a substrate 10. The mask layer 15 is formed by, for example, a thermal oxidation process and/or a chemical vapor deposition (CVD) process. The substrate 10 is, for example, a p-type silicon or germanium substrate with an impurity concentration in a range from about $1 \times 10^{15}$ cm$^{-3}$ to about $1 \times 10^{16}$ cm$^{-3}$. In other embodiments, the substrate is an n-type silicon or germanium substrate with an impurity concentration in a range from about $1 \times 10^{15}$ cm$^{-3}$ to about $1 \times 10^{16}$ cm$^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 15 includes, for example, a pad oxide (e.g., silicon oxide) layer 15A and a silicon nitride mask layer 15B in some embodiments.

The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

Figure 2:
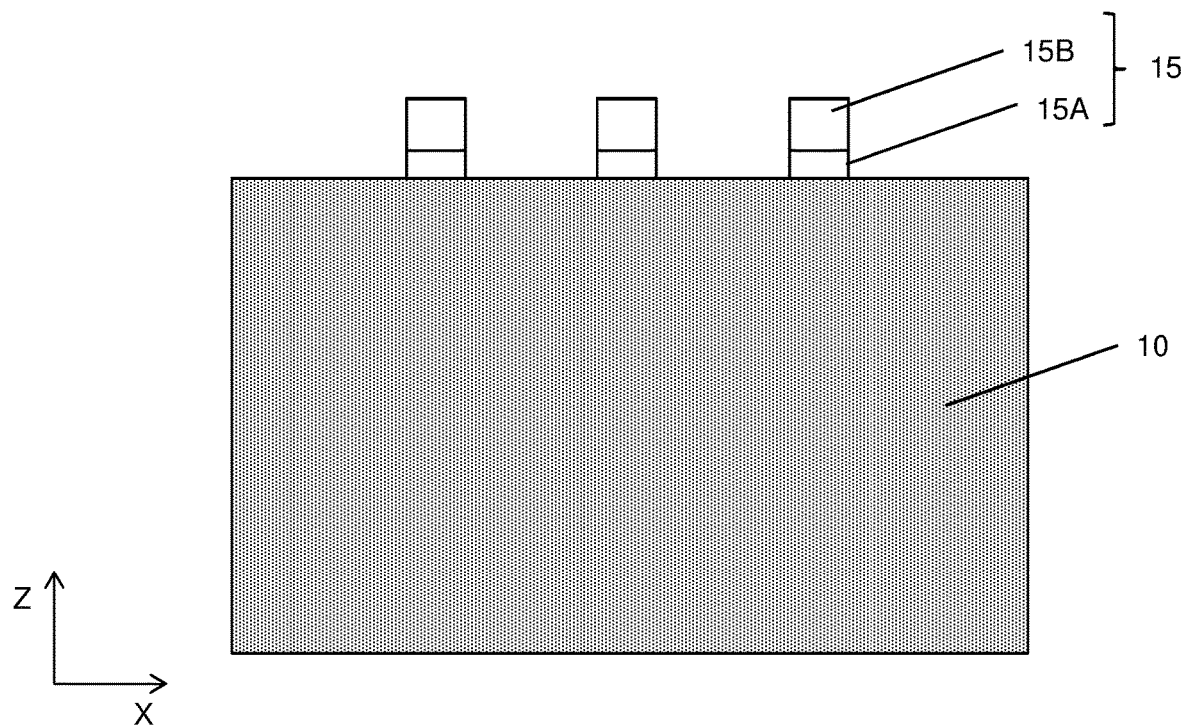
FIGS. 2-16 show exemplary cross sectional views of various stages for manufacturing a Fin FET device according to one embodiment of the present disclosure.

By using the mask pattern as an etching mask, a hard mask pattern 15 of the pad oxide layer and the silicon nitride mask layer is formed, as shown in FIG. 2.

Figure 3:
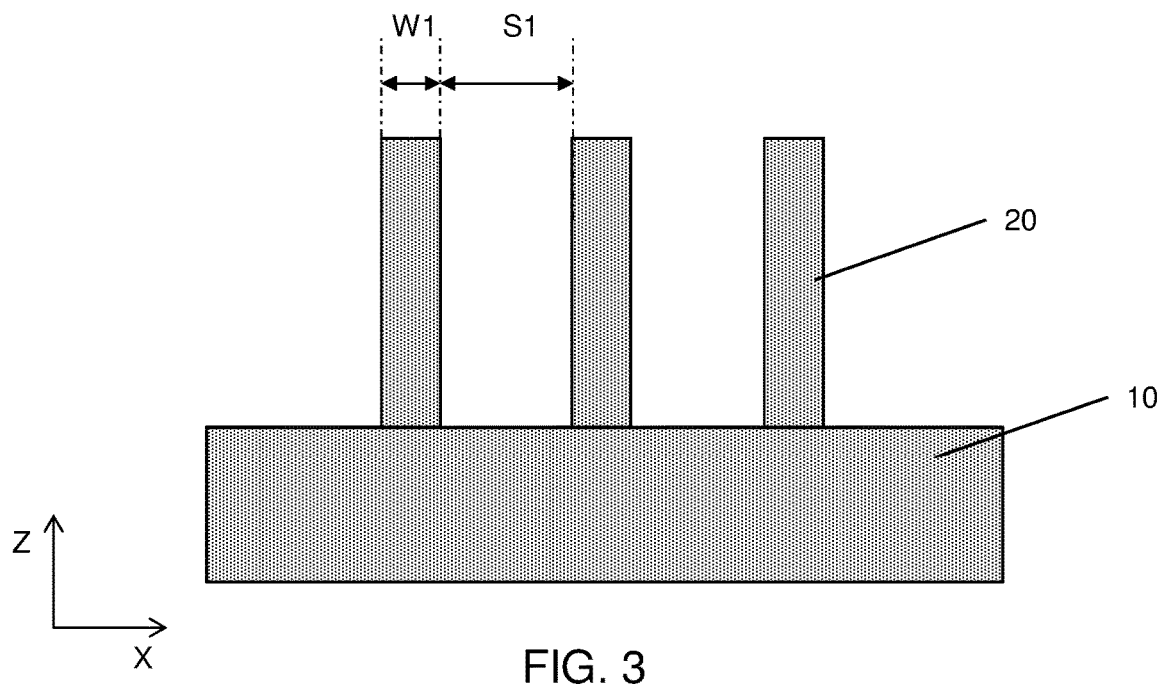

Then, as shown in FIG. 3, by using the hard mask pattern 15 as an etching mask, the substrate 10 is patterned into fin structures 20 by trench etching using a dry etching method and/or a wet etching method.

In FIG. 3, three fin structures 20 are disposed over the substrate 10. However, the number of the fin structures is not limited to three. The numbers may be as small as one or more than three. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W1 of the fin structure 20 is in a range from about 5 nm to about 40 nm in some embodiments, and is in a range from about 7 nm to about 12 nm in other embodiments. The space 51 between two fin structures is in a range from about 10 nm to about 50 nm in some embodiments. The height (along the Z direction) of the fin structure 20 above the substrate 10 is in a range from about 100 nm to about 300 nm in some embodiments, and is in a range from about 50 nm to 100 nm in other embodiments.

The lower part of the fin structure 20 under the gate structure 40 (see, FIGS. 6B and 7A) may be referred to as a well region, and the upper part of the fin structure 20 may be referred to as a channel region. Under the gate structure 40, the well region is embedded in the isolation insulating layer 30 (see, FIG. FIGS. 6B and 7A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

Figure 4:
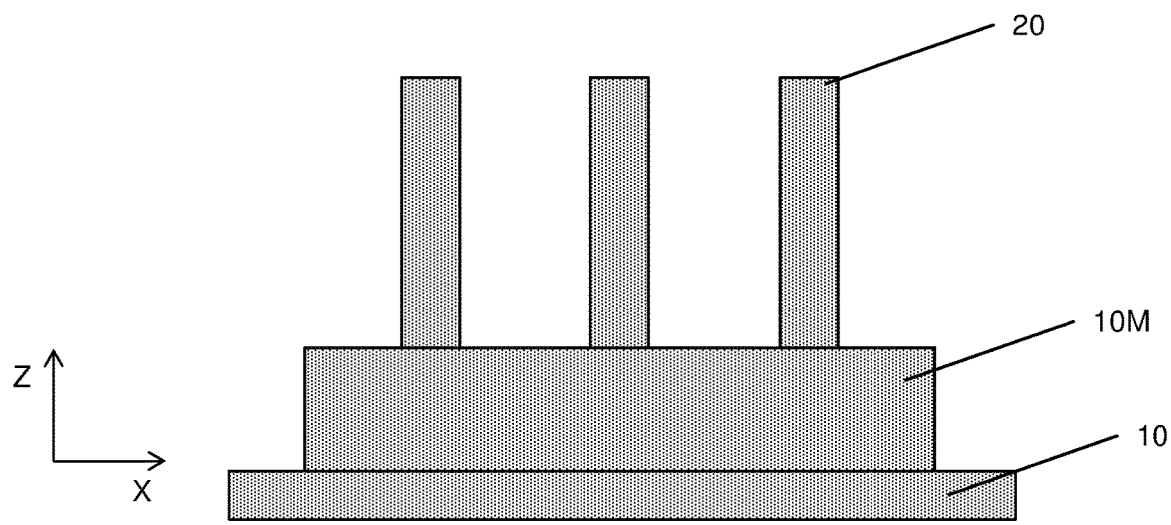

In some embodiments, after the fin structures 20 are formed, the substrate 10 is further etched to form a mesa shape 10M, as shown in FIG. 4. In other embodiments, the mesa shape 10M is first formed, and then the fin structures 20 are formed. The mesa shape is not formed in certain other embodiments.

After the fin structures 20 and the mesa shape 10M are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 5:
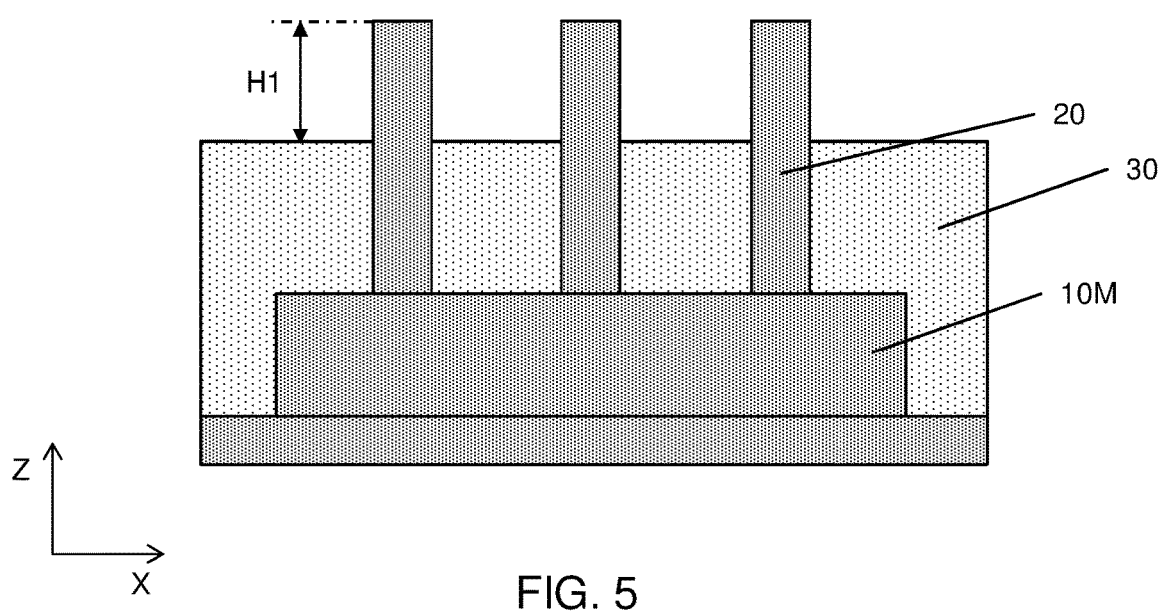

The insulating layer 30 is first formed in a thick layer so that the fin structures are embedded in the thick layer, and the thick layer is recessed so as to expose the upper portions of the fin structures 20, as shown in FIG. 5. The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 6A:
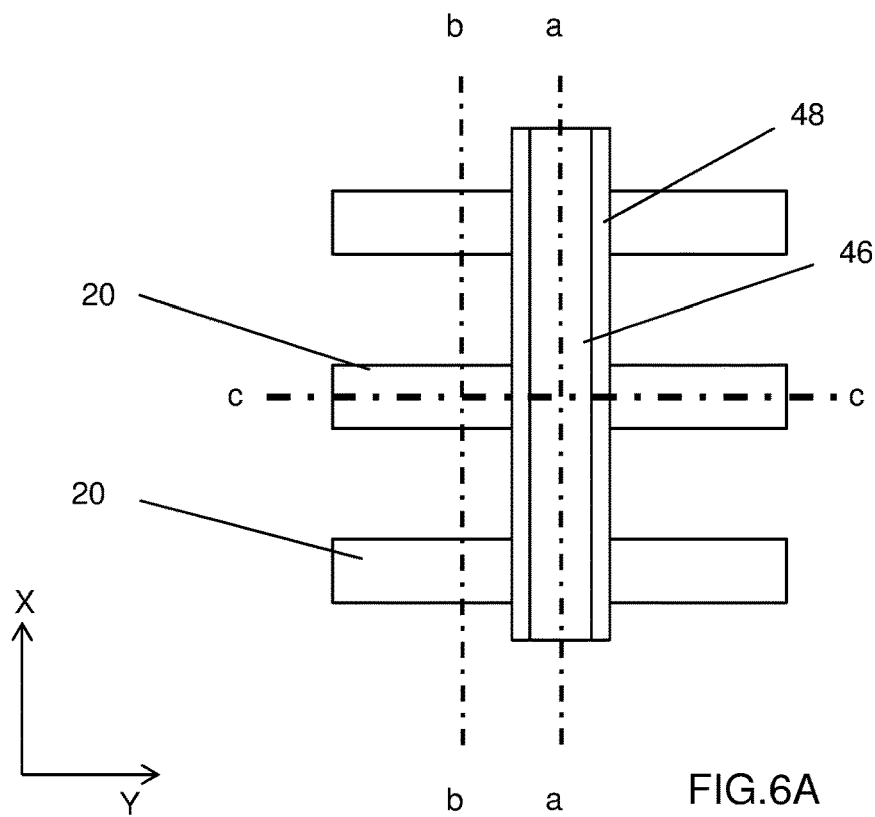
Figure 6B:
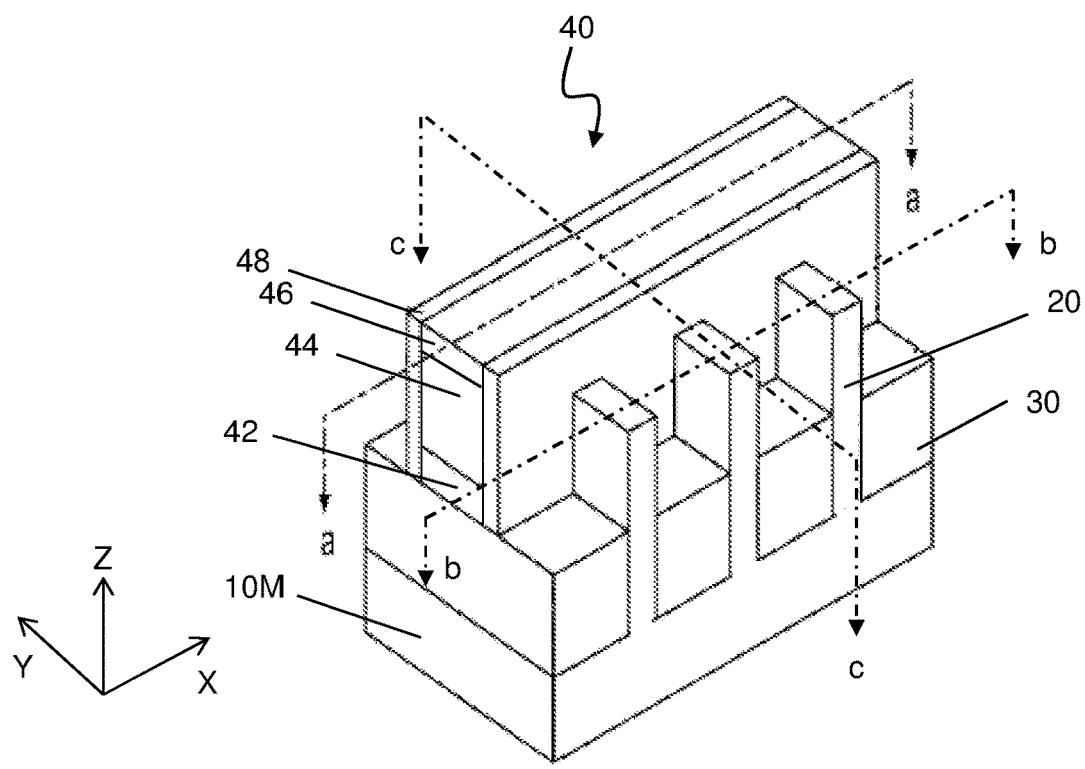
Figure 7A:
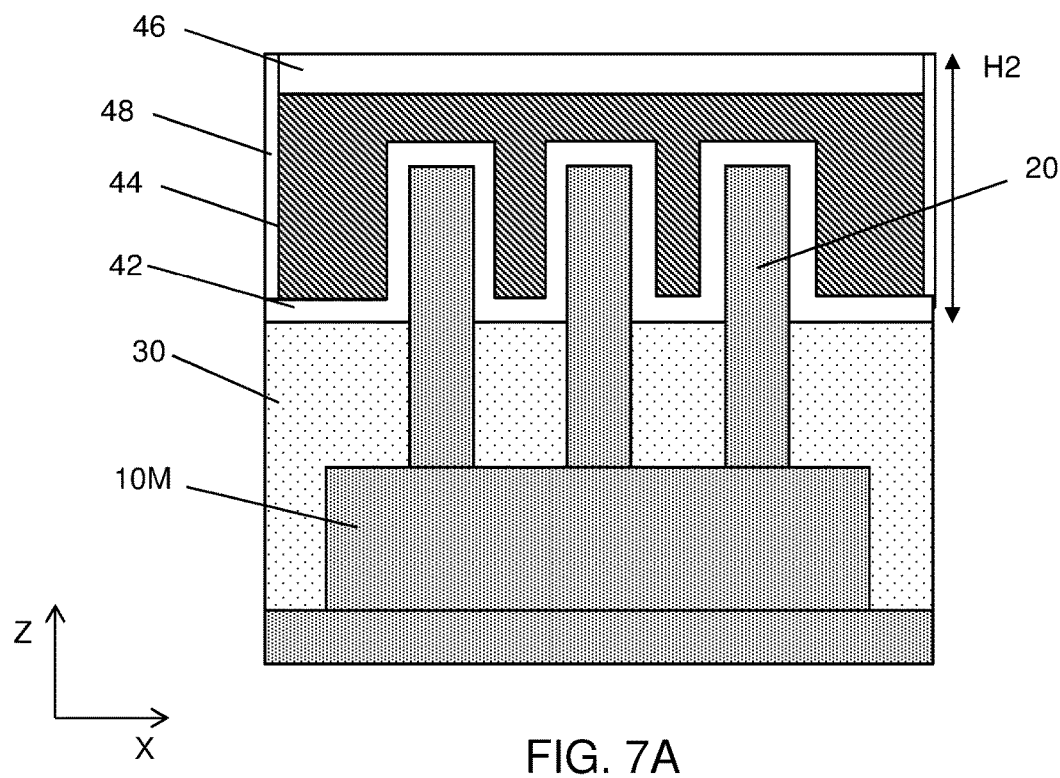
Figure 7B:
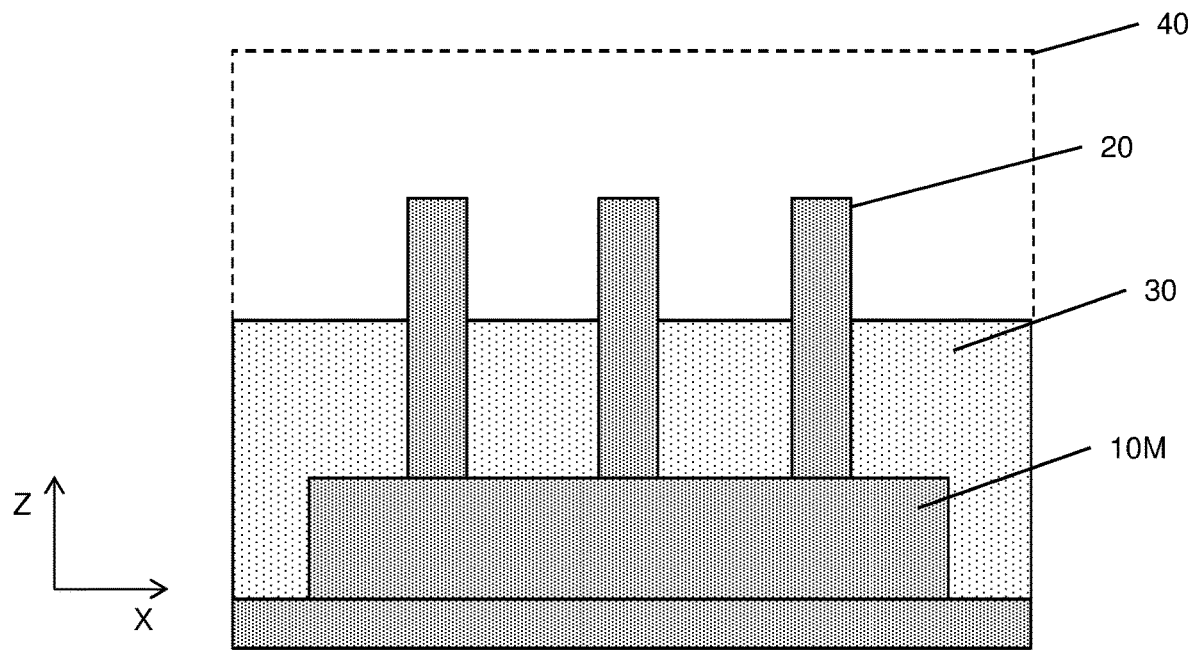

After the insulating layer 30 is formed, a gate structure 40 is formed over the fin structures 20, as shown in FIGS. 6A and 6B. FIG. 6A is a plan view (view from the above) and FIG. 6B is an exemplary perspective view. FIG. 7A is an exemplary cross sectional view along the line a-a of FIGS. 6A and 6B and FIG. 7B is an exemplary cross sectional view along the line b-b of FIGS. 6A and 6B. FIGS. 8-11 and 13-16 are also exemplary cross sectional views corresponding to the line b-b of FIGS. 6A and 6B. FIG. 12A is an exemplary cross sectional view corresponding to the line c-c of FIGS. 6A and 6B, and FIG. 12B is an exemplary cross sectional view corresponding to the line b-b of FIGS. 6A and 6B.

As shown in FIGS. 6A and 6B the gate structure 40 extends in the X direction, while the fin structures 20 extend in the Y direction.

To fabricate the gate structure 40, a dielectric layer and a poly silicon layer are formed over the isolation insulating layer 30 and the exposed fin structures 20, and then patterning operations are performed so as to obtain gate structures including a gate pattern 44 made of poly silicon and a dielectric layer 42. In some embodiments, the polysilicon layer is patterned by using a hard mask and the hard mask remains on the gate pattern (gate electrode layer) 44 as a cap insulating layer 46. The hard mask (cap insulating layer 46) includes one or more layers of insulating material. The cap insulating layer 46 includes a silicon nitride layer formed over a silicon oxide layer in some embodiments. In other embodiments, the cap insulating layer 46 includes a silicon oxide layer formed over a silicon nitride layer. The insulating material for the cap insulating layer 46 may be formed by CVD, PVD, ALD, e-beam evaporation, or other suitable process.

In some embodiments, the dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. The height H2 of the gate structures (see, FIG. 7A) is in a range from about 50 nm to about 400 nm in some embodiments, and is in a range from about 100 nm to 200 nm in other embodiments.

In some embodiments, a gate replacement technology is employed. In such a case, the gate pattern 44 and the dielectric layer 42 are a dummy gate electrode and a dummy gate dielectric layer, respectively, which are subsequently removed. If a gate-first technology is employed, the gate pattern 44 and the dielectric layer 42 are used as a gate electrode and a gate dielectric layer.

Further, gate sidewall spacers 48 are formed on both sidewalls of the gate pattern. The sidewall spacers 48 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material and performing anisotropic etching. In one embodiment, the sidewall spacer layers are made of silicon nitride based material, such as SiN, SiON, SiOCN or SiCN.

Figure 8:
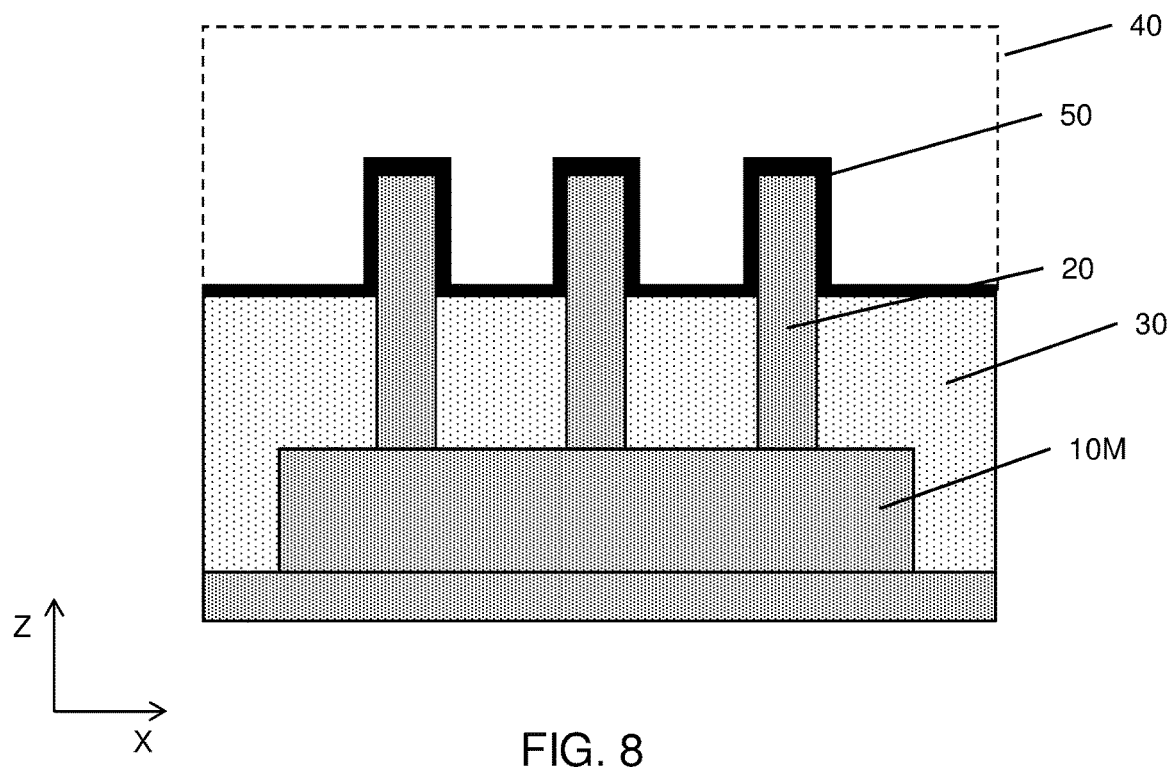

Then, as shown in FIG. 8, a fin mask layer 50 is formed over the fin structures 20. The fin mask layer 50 is made of dielectric material including silicon nitride based material, such as SiN, SiON, SiOCN or SiCN. In one embodiment, SiN is used as the fin mask layer 50. The fin mask layer 50 is formed by CVD, PVD, ALD, e-beam evaporation, or other suitable process. The thickness of the fin mask layer 50 is in a range from about 3 nm to about 10 nm in some embodiments. The variation of the thickness is within about ±2 nm in certain embodiments.

In some embodiments, the fin mask layer 50 and the sidewall spacers 48 for the gate structure are separately formed. In other embodiments, the same blanket layer is used for the fin mask layer 50 and the sidewall spacers 48.

Figure 9:
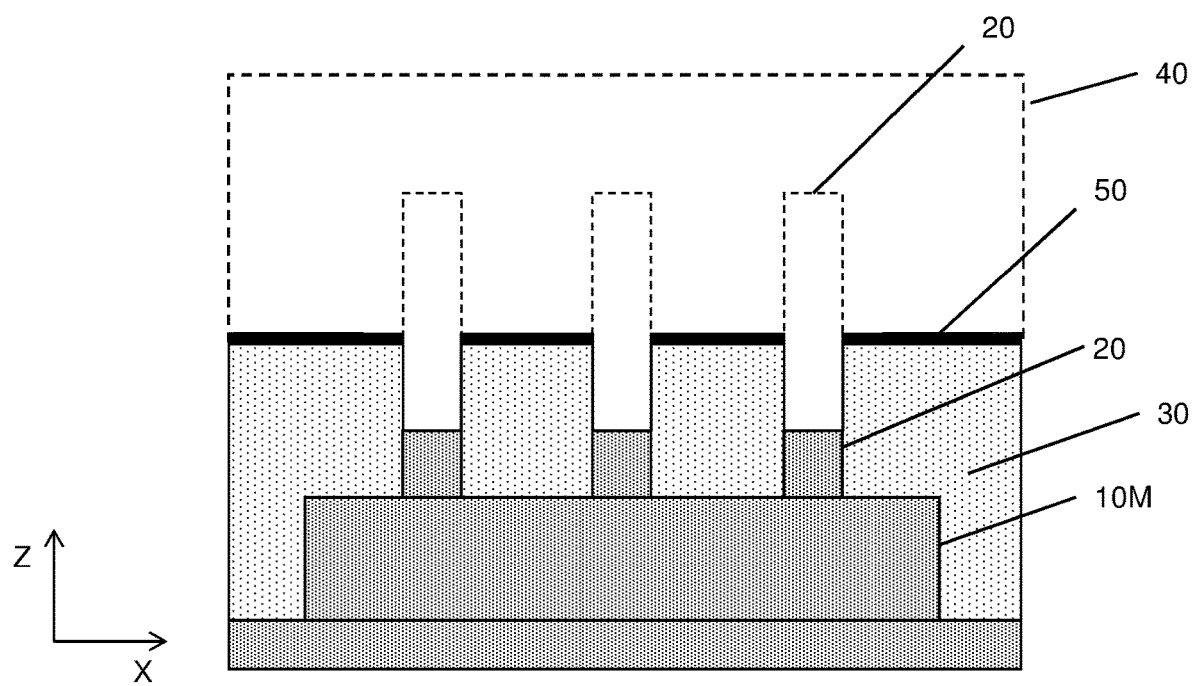

After forming the fin mask layer 50, the upper portion of the fin structures 20 are recessed and a part of the fin mask layer 50 disposed on side surfaces and the top surface of the fin structures protruding from the isolation insulating layer are removed by a dry etching and/or a wet etching operation. The upper portion of the fin structures 20 are recessed (etched) down to the level equal to or below the upper surface of the upper surface isolation insulating layer 30, as shown in FIG. 9.

Figure 10:
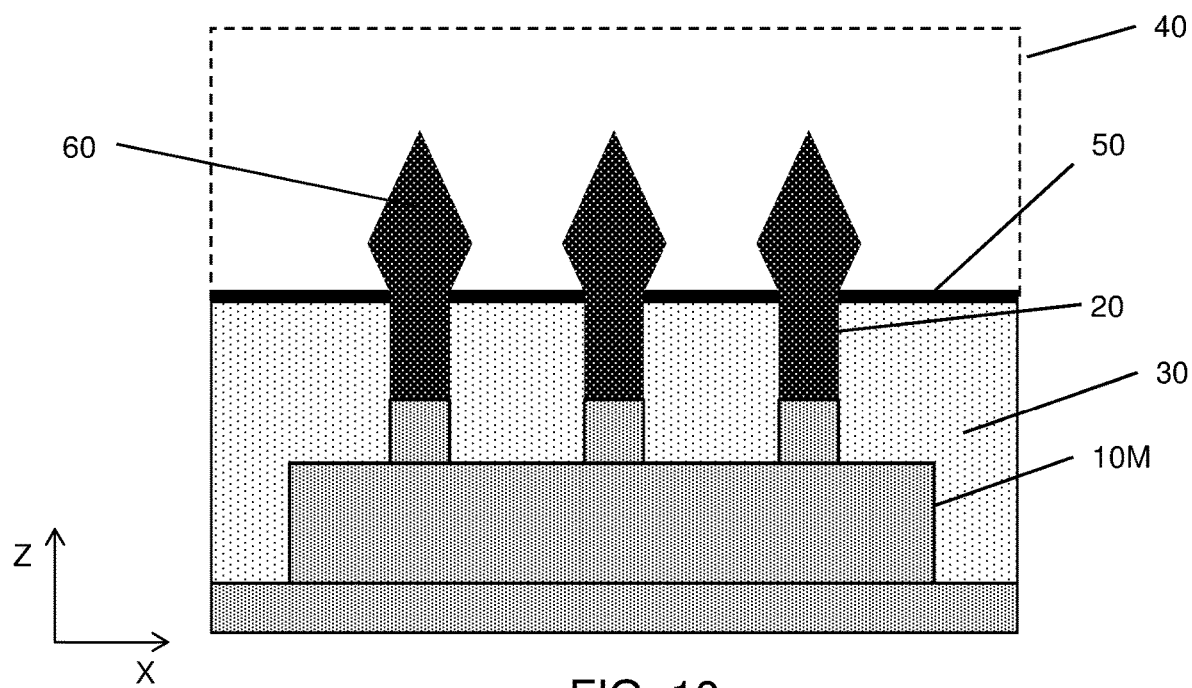

Then, as shown in FIG. 10, an epitaxial source/drain structure 60 is formed over the recessed fin structures 20. In this disclosure, a source and a drain are interchangeably used, and a source/drain (or S/D) refers to one of or both of a source and a drain.

The epitaxial source/drain structure 60 is made of one or more layers of semiconductor material having a different lattice constant than the fin structures 20 (channel regions). When the fin structures are made of Si, the epitaxial source/drain structure 60 includes SiP, SiC or SiCP for an n-channel Fin FET. In this embodiment, SiP is used. An amount of P in the SiP layer is in a range from about $1 \times 10^{20}$ cm$^{-3}$ to about $5 \times 10^{21}$ cm$^{-3}$ in some embodiments. In certain embodiments, the SiP layer includes two or more SiP layers with different P amounts.

Further, in some embodiments, the epitaxial source/drain structure 60 includes two or more epitaxially grown semiconductor layers. In certain embodiments, the epitaxial source/drain structure 60 includes a first SiP layer 62 formed on the recessed fin structure and a second SiP layer 64 formed on the first SiP layer 62 (see, FIGS. 12A and 12B).

An amount of phosphorous in the first SiP layer 62 is smaller than an amount of phosphorous in the second SiP layer 64. In some embodiments, the amount of phosphorous in the first SiP layer 62 is in a range from about $2 \times 10^{20}$ cm$^{-3}$ to about $7 \times 10^{20}$ cm$^{-3}$, and the amount of phosphorous in the second SiP layer 64 is in a range from about $3 \times 10^{20}$ cm$^{-3}$ to about $4 \times 10^{21}$ cm$^{-3}$.

The epitaxial source/drain structure 60 is epitaxially formed over the upper portions of the recessed fin structures, and thus has a crystalline structure. Due to the crystal orientation of the substrate formed into the fin structures 20 (e.g., (100) plane), the epitaxial source/drain structure 60 grows laterally and has a diamond-like shape.

The source/drain epitaxial layer 60 may be grown at a temperature of about 600 to 800° C. under a pressure of about 80 to 150 Torr, by using a Si containing gas such as SiH$_4$, Si$_2$H$_6$ or SiCl$_2$H$_2$, and/or a dopant gas, such as PH$_3$.

Figure 11:
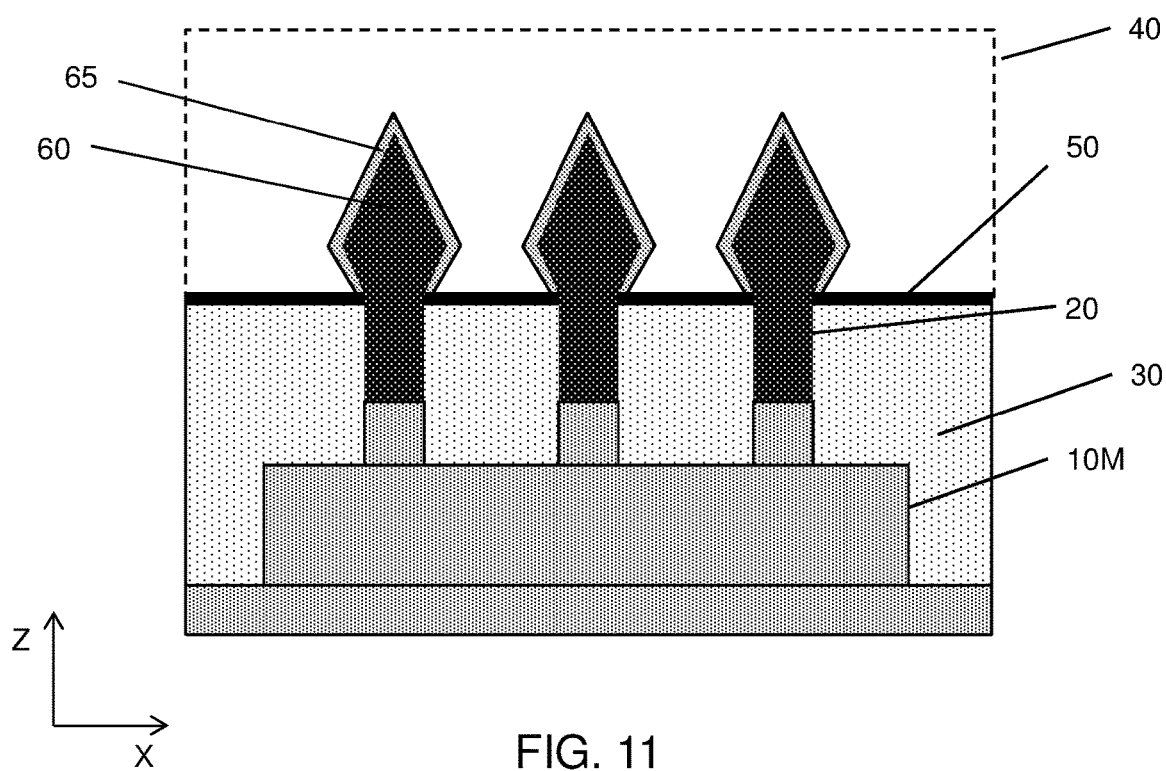
Figures 12A, 12B:
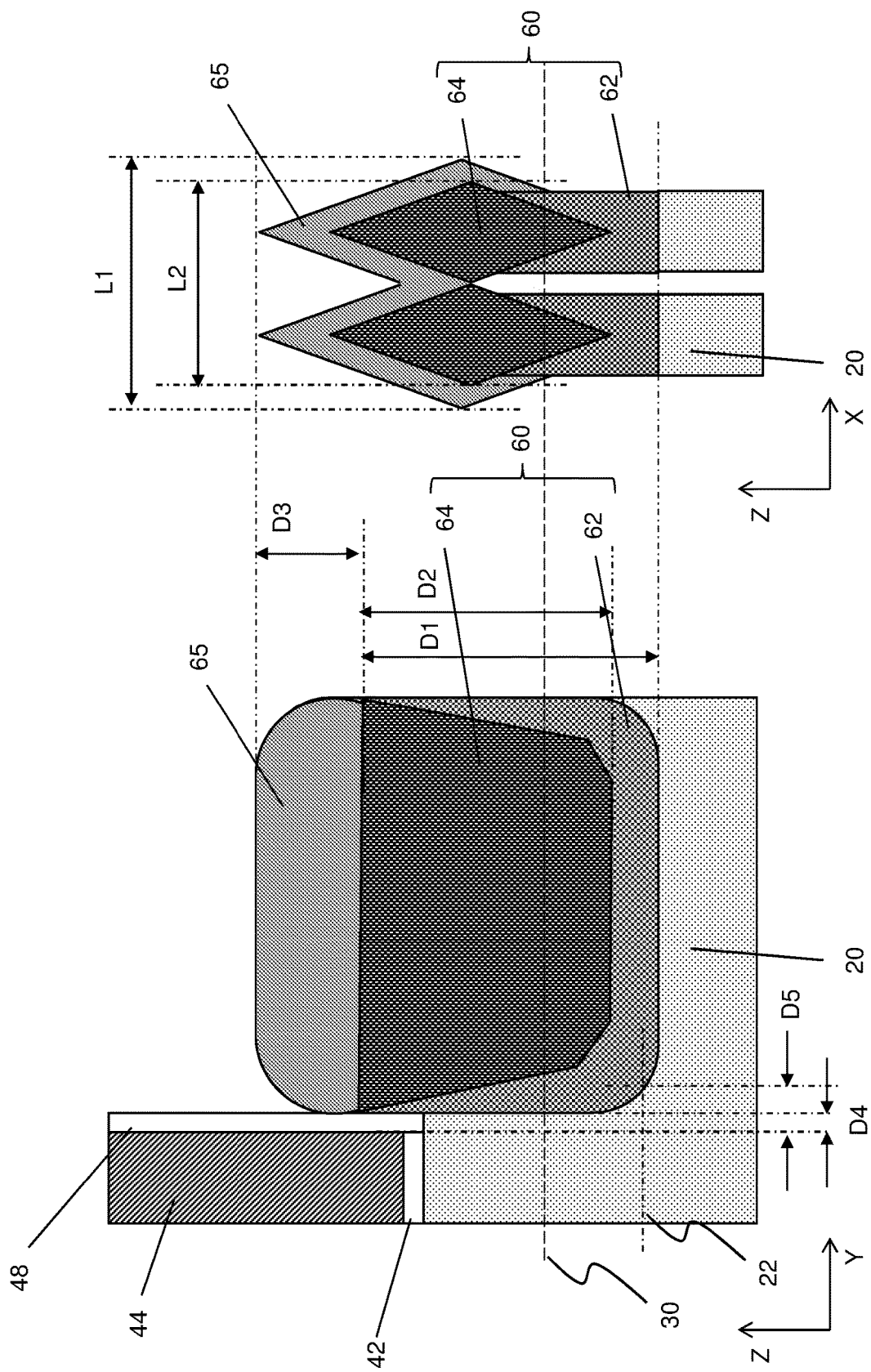

After forming the epitaxial source/drain structure 60, a Si$_{1-x}$Ge$_x$ layer 65 doped with phosphorous (P) (SiGe:P) is formed by an epitaxial deposition process over the source/drain epitaxial layer 60, as shown in FIG. 11. The fraction x of Ge in the SiGe:P 65 is in a range from about 0.25 to about 0.50 in some embodiments, and is in a range from about 0.30 to about 0.40 in other embodiments. An amount of phosphorous in the SiGe:P layer 65 is in a range from about $1 \times 10^{20}$ cm$^{-3}$ to about $5 \times 10^{21}$ cm$^{-3}$ in some embodiments, and in a range from about $5 \times 10^{20}$ cm$^{-3}$ to about $1 \times 10^{21}$ cm$^{-3}$ in other embodiments.

FIG. 12A shows an exemplary cross sectional view corresponding to the line c-c of FIGS. 6A and 6B and FIG. 12B is an exemplary cross sectional view corresponding to the line b-b of FIGS. 6A and 6B. As shown in FIG. 12A, the lower part of the epitaxial source/drain structure is disposed below the upper surface of the isolation insulating layer 30. A depth D1 of the first SiP layer 62 from the interface between the epitaxial source/drain structure 60 and the SiGe:P layer 65 is in a range from about 40 nm to about 70 nm in some embodiments. A depth D2 of the second SiP layer 64 from the interface between the epitaxial source/drain structure 60 and the SiGe:P layer 65 is in a range from about 30 nm to about 60 nm in some embodiments. The depth (thickness) D3 of the SiGe:P layer 65 is in a range about 1 nm to about 20 nm in some embodiments, and is in a range from about 5 nm to about 10 nm in other embodiments. The distance D4 between the gate electrode 44 and the epitaxial source/drain structure 60 measured at the level of the upper surface of the isolation insulating layer 30 is in a range from about 2 nm to about 10 nm in some embodiments. The distance D5 between the gate electrode 44 and the epitaxial source/drain structure 60 measured at the level of the bottom 22 of the fin structure 20 is in a range from about 2 nm to about 15 nm in some embodiments.

In FIG. 11, the epitaxial source/drain structures of adjacent fin structures are separated from each other. In other embodiments, two or more epitaxial source/drain structures of adjacent fin structures are merged as shown in FIG. 12B. In such a case, the epitaxial source/drain structures 60 (the second SiP layers 64) are merged and the SiGe:P layer 65 is formed over the merged epitaxial source/drain structures. When two epitaxial layers are merged, the width L1 of the merged SiGe:P layer 65 is in a range from 60 nm to about 80 nm and the width L2 of the merged SiP layers 64 is in a range from about 45 nm to about 60 nm, in some embodiments. When the two epitaxial layers are not merged (a single fin), the outer most width of the SiGe:P layer 65 is in a range from about 30 nm to about 40 nm in some embodiments. As shown in FIG. 12B, the first SiP layer 62 is formed directly on the recessed fin structure 20 and the second SiP layer 64 is formed directly on the first SiP layer 62 in tome embodiments.

Figure 13:
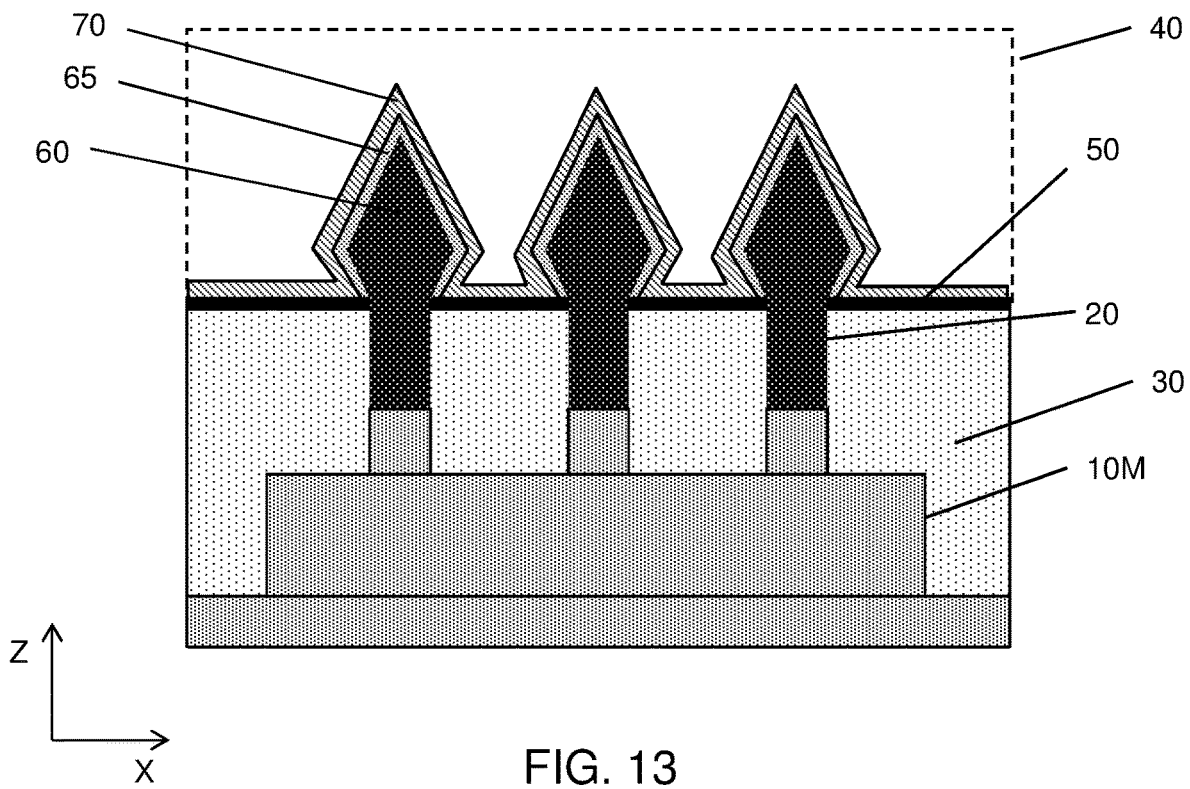

Next, as shown in FIG. 13, a metal layer 70 is formed over the SiGe:P layer 65. The metal material for the metal layer 70 includes one of Ti, Co, Ni, W or Ta. In one embodiment, Ti is used for the metal layer 70. The thickness of the metal layer 70 is in a range from about 1 nm to about 15 nm in some embodiments, and is in a range from about 3 nm to about 10 nm in other embodiments.

Figure 14:
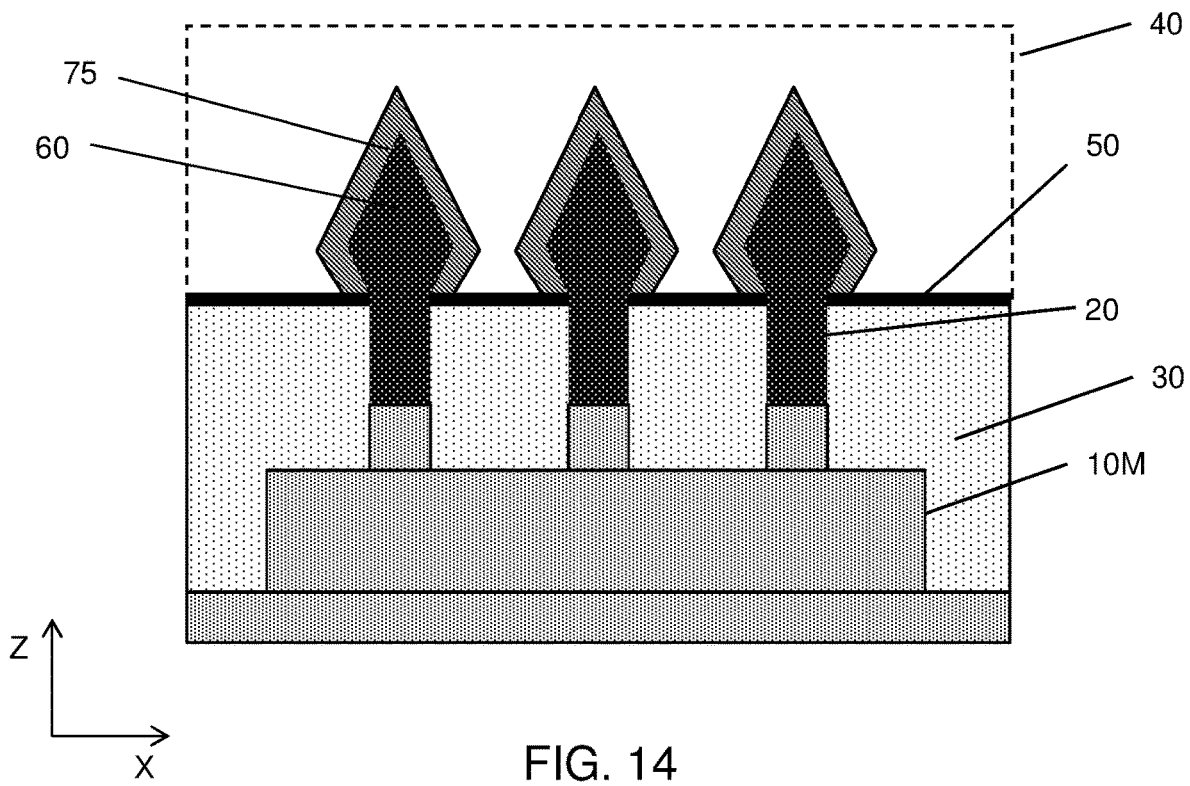

After the metal layer 70 is formed, a thermal operation (annealing) is performed so as to form an alloy layer 75 containing Si, Ge and Ti, for example, a Ti(SiGe)$_2$ layer is formed, as shown in FIG. 14.

The annealing operation is performed at a temperature from about 500° C. to about 1100° C. in some embodiments. In certain embodiments, the annealing is performed at a temperature in a range from about 700° C. to about 1000° C. for a time period from about 10 sec to about 200 sec. In other embodiments, the annealing is performed at a temperature in a range from about 800° C. to about 1100° C. for a time period from about 1 µsec to about 1 sec. In other embodiments, the annealing period is in the millisecond range, for example, in a range from about 1 msec to about 100 msec. The annealing operation is performed in an inert gas ambient.

The thickness of the silicide-germanide (alloy) layer 75 is in a range from about 1 nm to about 10 nm in some embodiments, and is in a range from about 3 nm to about 5 nm in other embodiments.

By the annealing operation, the SiGe:P layer 65 is substantially completely consumed to form the alloy layer 75 in some embodiments. In other embodiments, only a part of the SiGe:P layer 65 is consumed to form the alloy layer 75 and the lower layer of the SiGe:P layer 65 remains between the alloy layer 75 and the epitaxial source/drain structure 60.

Further, in some embodiments, the Ti layer 70 is not completely consumed, and a part of the Ti layer 70 remains over the alloy layer 75. In such a case, the remaining Ti layer 70 is removed by an appropriate etching operation. As shown in FIG. 14, the alloy layer 75 is in contact with the remaining fin mask layer 50.

Figure 15:
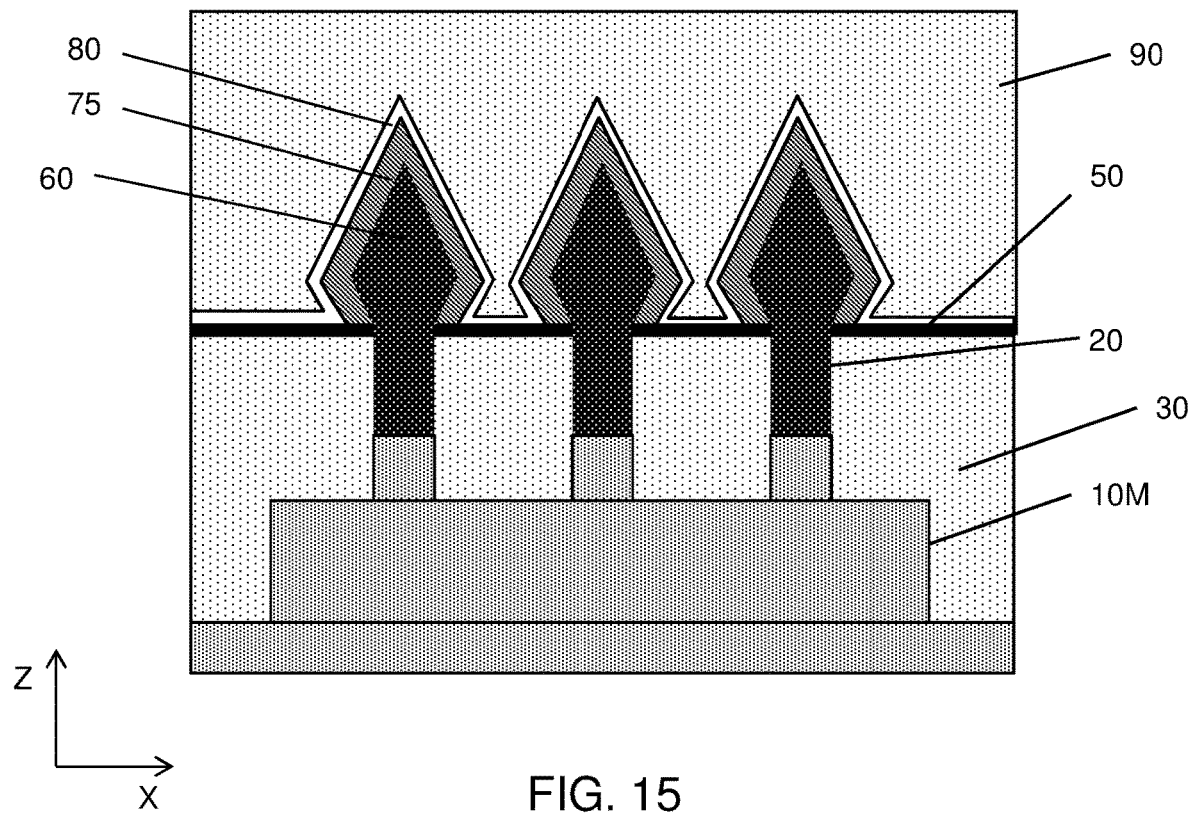
Figure 16:
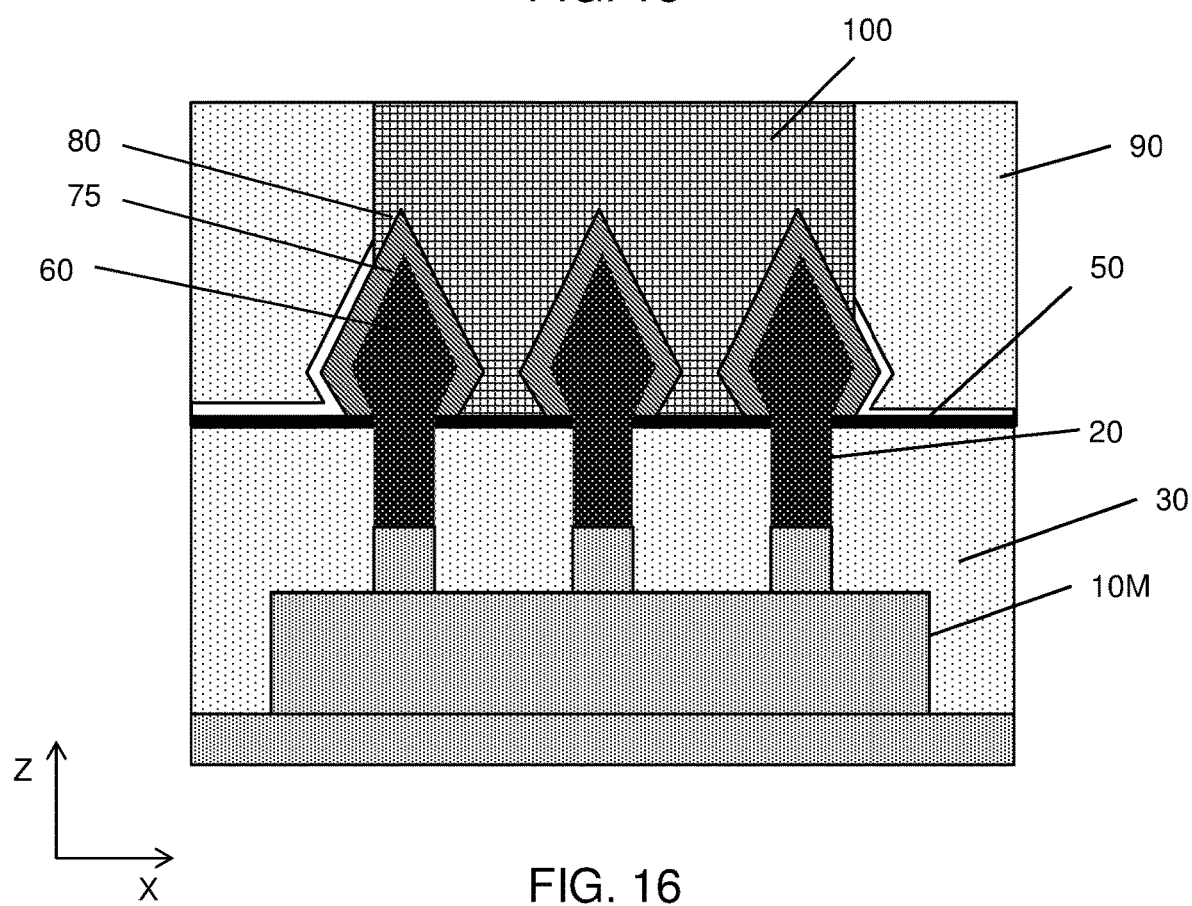

Then, as shown in FIG. 15, an insulating layer 80, which functions as an etching stop layer in subsequent contact etching, and a first interlayer dielectric (ILD) layer 90 are formed. The first ILD layer 90 may include two or more ILD layers.

The insulating layer 80 includes one or more layers of insulating material, such as SiN, SiON, SiOCN or SiCN. In one embodiment, SiN is used as the first insulating layer 80. The first ILD layer 90 includes one or more layers of insulating material, such as $SiO_2$, SiON or SiOC, or a low-k dielectric material. In one embodiment, $SiO_2$ is used as the first ILD layer 90.

Then, by using a lithography operation and an etching operation, a contact hole is formed in the insulating layer 80 and the first ILD layer 90, and the contact hole is filled with a conductive material, thereby forming a contact plug 100. The contact plug 100 may include a single layer or multiple layers of any suitable metal such as Co, W, Ti, Ta, Cu, Al and/or Ni and/or nitride thereof.

In some embodiments, a metal gate structure (not shown) is formed by a gate replacement technology. After forming the alloy layer 75, and before forming the contact hole, the dummy gate structures (dummy gate electrode layer 44 and dummy gate dielectric layer 42) are removed and replaced with a metal gate structures (metal gate electrode and gate dielectric layer).

A dielectric layer is formed over the dummy gate structures and a planarization operation, such as a chemical mechanical polishing (CMP) process or an etch-back process, is performed to expose the upper surface of the dummy gate electrode layer 44. Then, the dummy gate electrode layer 44 and the dummy gate dielectric layer 42 are removed, by appropriate etching processes, respectively, to form a gate opening. Metal gate structures including a gate dielectric layer and metal gate electrode are formed in the gate openings.

The gate dielectric layer may be formed over an interface layer (not shown) disposed over the channel layer of the fin structures 20. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode is formed over the gate dielectric layer. The metal gate electrode includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structures, planarization operations, such as CMP, are performed.

After forming the contact plug 100, further CMOS processes are performed to form various features such as additional interlayer dielectric layer, contacts/vias, interconnect metal layers, and passivation layers, etc.

FIGS. 17-21 show exemplary cross sectional views of various stages for manufacturing a Fin FET device according to another embodiment of the present disclosure. It is understood that additional operations can be provided before, during, and after processes shown by FIGS. 17-21, and some of the operations described below can be replaced or eliminated, for additional embodiments of the method. The order of the operations/processes may be interchangeable. Further, the configurations, structures, operations and/or materials used for FIGS. 1A-1C and FIGS. 2-16 may be applied to the manufacturing processes shown by FIGS. 17-21, and the detailed description may be omitted.

In this embodiment, the alloy layer of SiGe:P and Ti is formed after the contact hole is opened.

Figure 17:
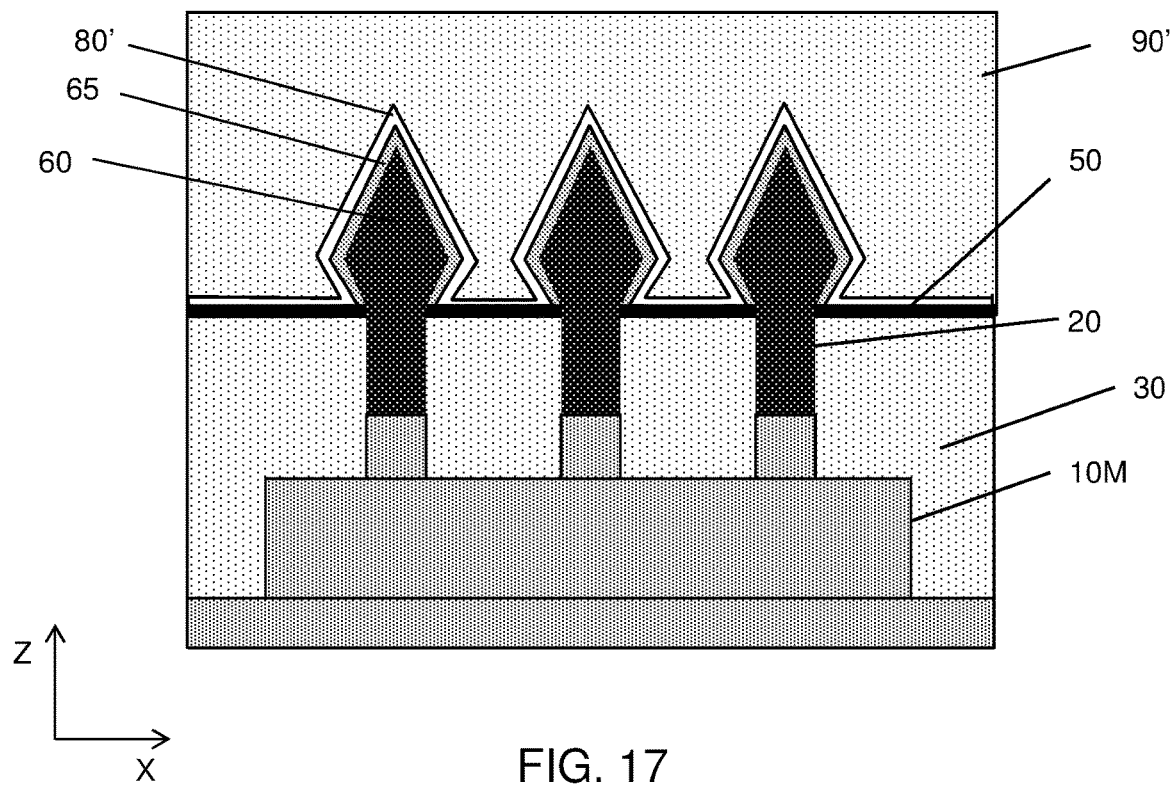
FIGS. 17-21 show exemplary cross sectional views of various stages for manufacturing a Fin FET device according to another embodiment of the present disclosure.

After the SiGe:P layer 65 is formed as shown in FIG. 11, an insulating layer 80', similar to the insulating layer 80, which functions as an etching stop layer in the subsequent contact etching, is formed. Then, a first ILD layer 90', similar to the first ILD layer 90, is formed, as shown in FIG. 17.

Figure 18:
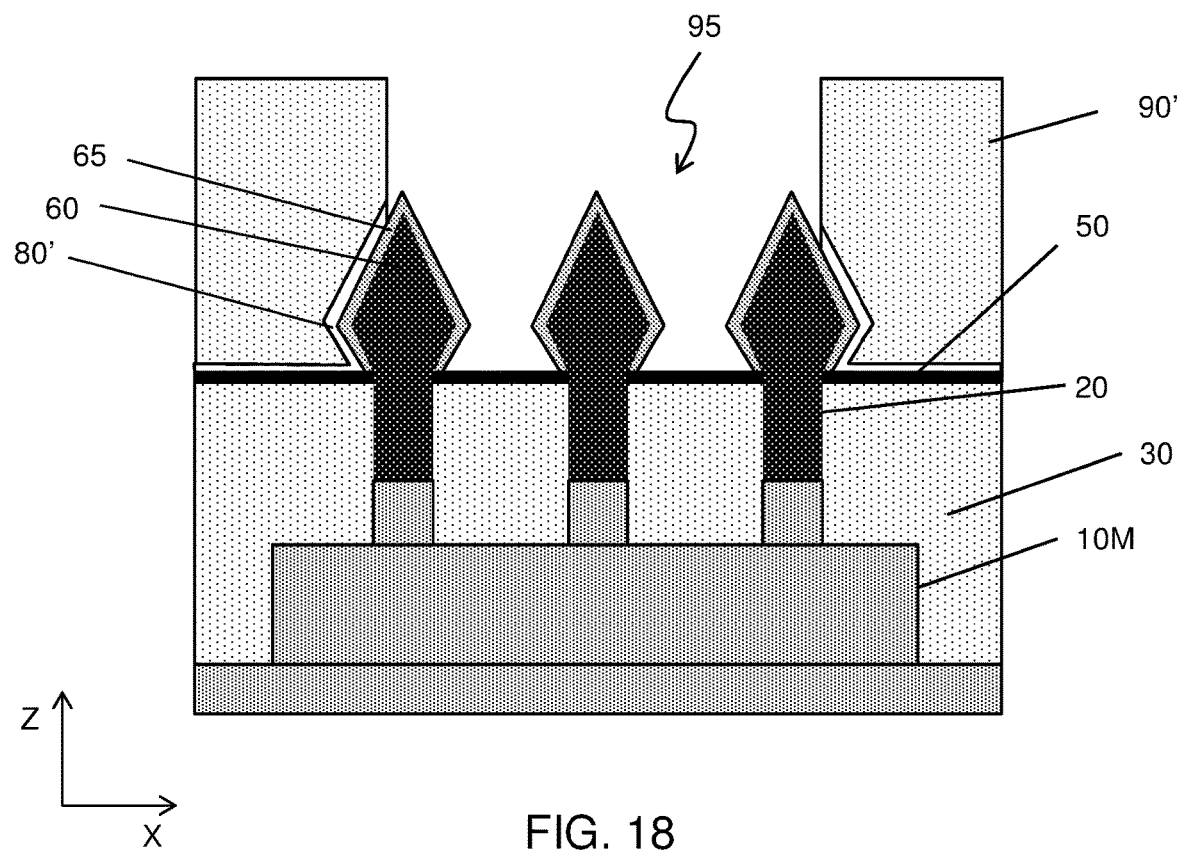

Then, by using a lithography operation and an etching operation, a contact hole 95 is formed in the insulating layer 80' and the first ILD layer 90', as shown in FIG. 18.

Figure 19:
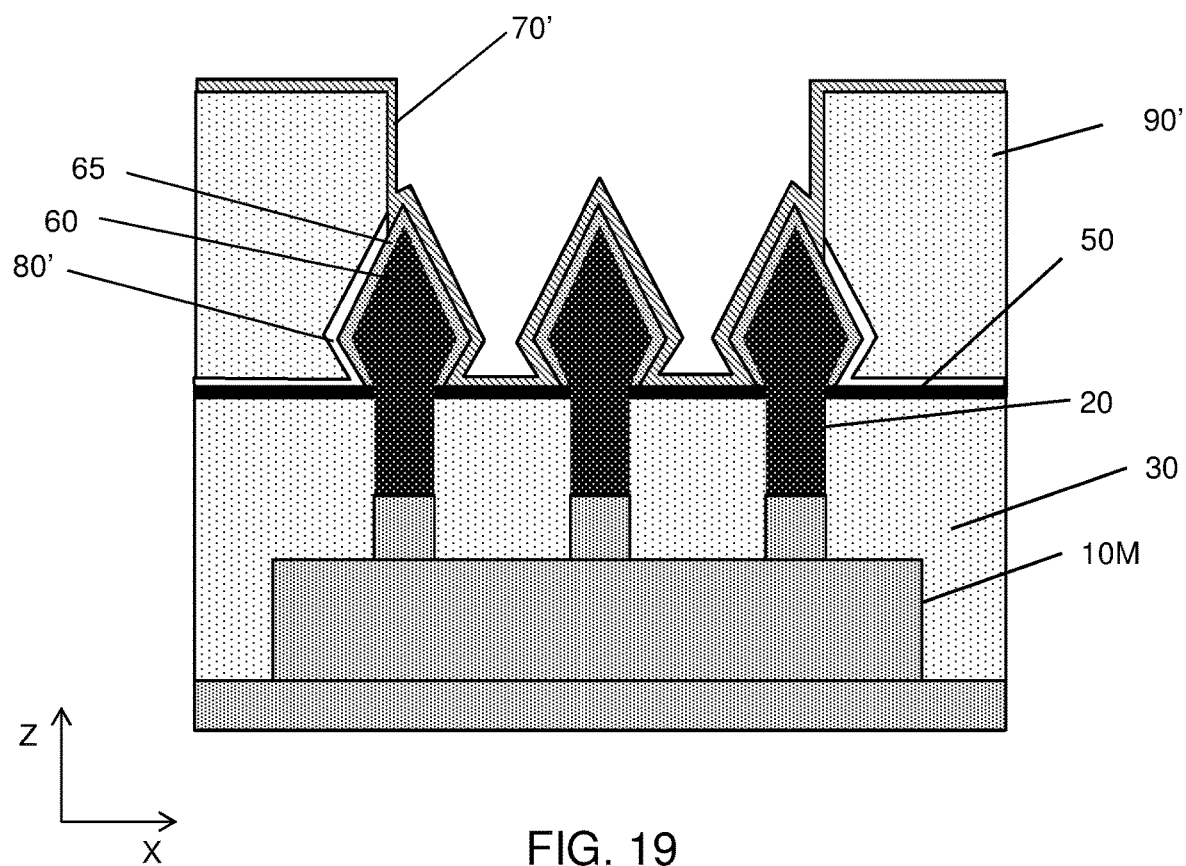

Then, as shown in FIG. 19, a metal layer 70', such as a Ti layer, is formed over the SiGe:P layer 65, similar to FIG. 13. As shown in FIG. 19, the Ti layer 70' is also formed on the walls of the contact hole 95 and the upper surface of the first ILD layer 90'.

Figure 20:
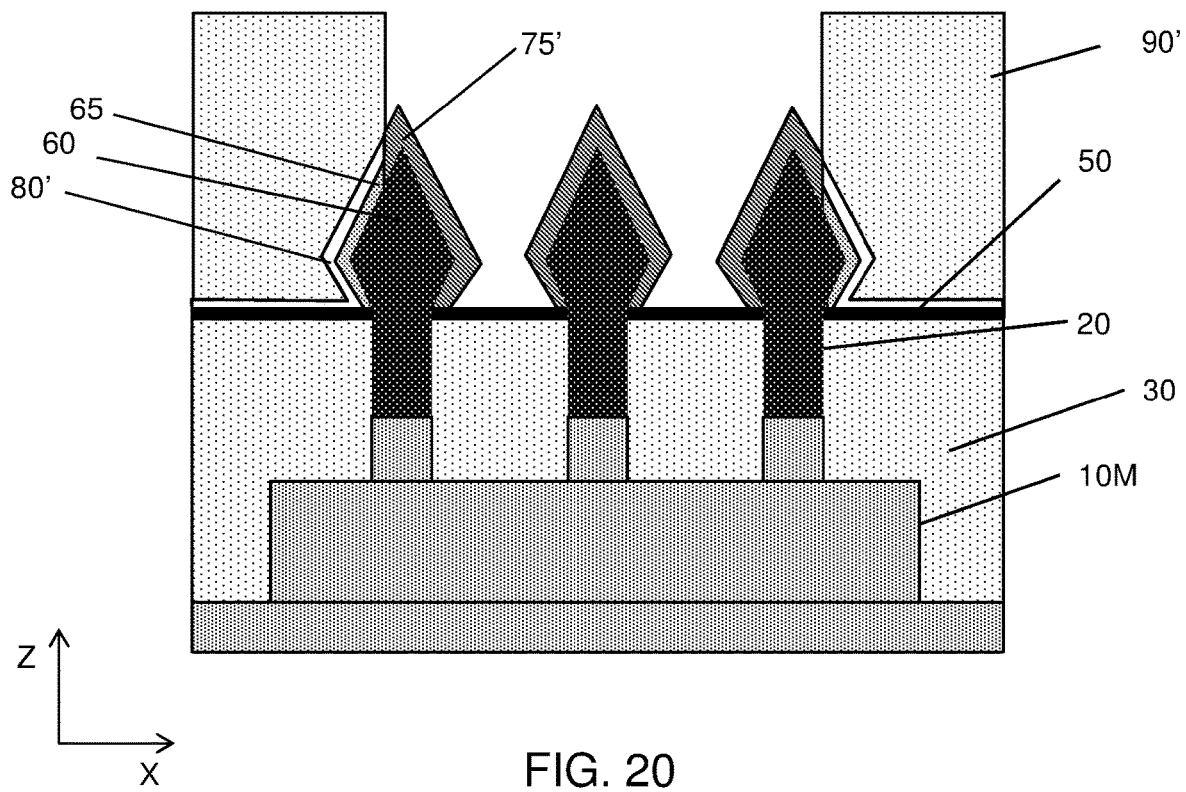

Similar to FIG. 14, a thermal process is performed so as to form an alloy layer 75' of Si, Ge and Ti, as shown in FIG. 20. In some embodiments, the Ti layer 70' is not completely consumed, and a part of the Ti layer 70' remains over the alloy layer 75'. In such a case, the remaining Ti layer 70' is removed by an appropriate etching operation. In other embodiments, the remaining Ti layer 70' is not removed.

Figure 21:
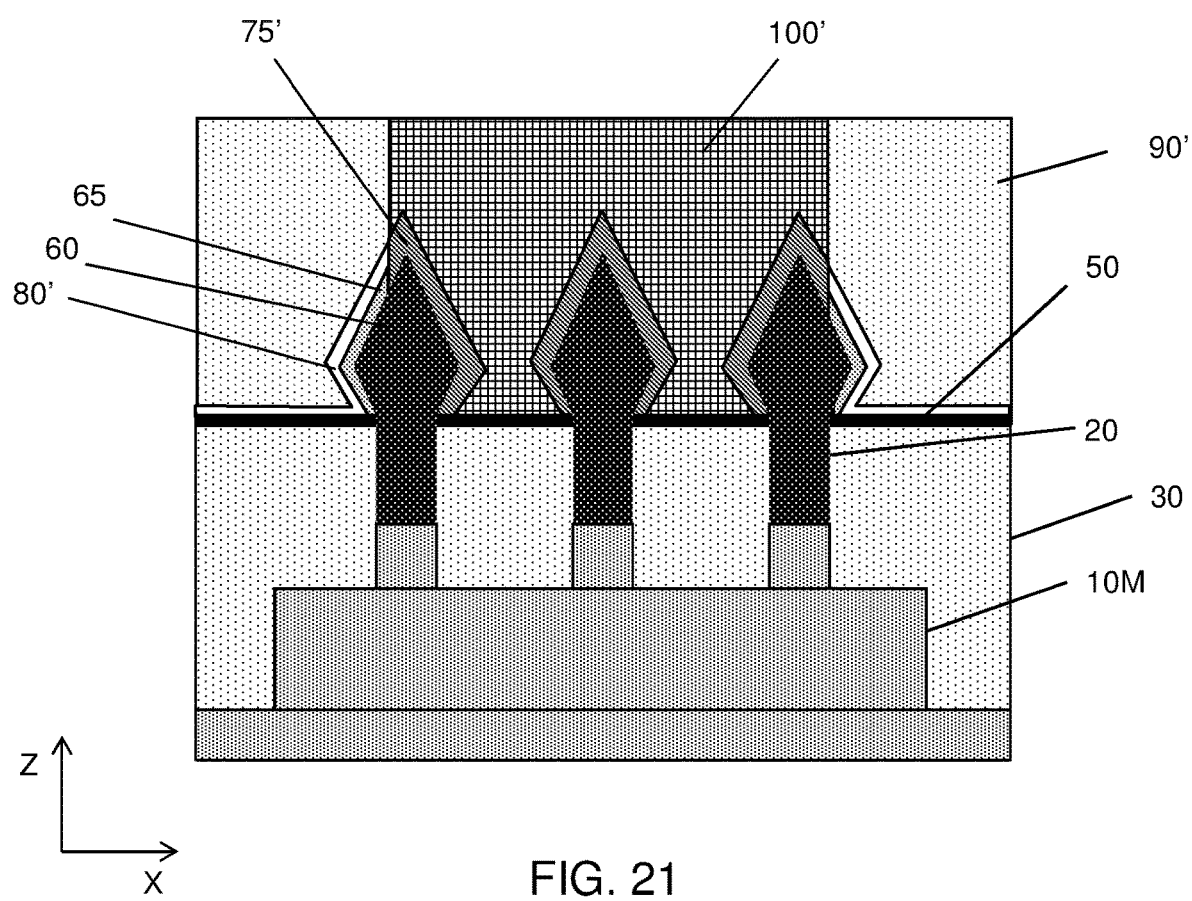

Then, as shown in FIG. 21, a conductive material is formed in the contact hole 95, so as to form a contact plug 100'. The conductive material is deposited in the contact hole 95 and the and over the first ILD layer 90, and then a CMP process is performed to obtain the contact plug 100'. Any unconsumed Ti layer 70' remaining on the upper surface of the first ILD layer 90 is removed by the CMP process.

After forming the contact plug 100', further CMOS processes are performed to form various features such as additional interlayer dielectric layers, contacts/vias, interconnect metal layers, and passivation layers, etc.

In the present disclosure, since a SiGe:P layer is formed between a Ti layer and a semiconductor layer (e.g., SiP layer) when forming an alloy layer for the source/drain structure, a Schottky barrier height (SBH) between the n-type semiconductor layer (SiP) layer and the TiSiGe layer can be reduced, thereby reducing the contact resistivity of the source/drain structure by about 70% compared with a TiSi layer.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a first layer containing a $Si_{1-x}Ge_x$ layer doped with phosphorous is formed over an n-type semiconductor layer, a metal layer containing a metal material is formed over the first layer, and a thermal process is performed to form an alloy layer including Si, Ge and the metal material.

In accordance with another aspect of the present disclosure, in a method of manufacturing a semiconductor device including a fin field effect transistor (FinFET), a fin structure is formed over a substrate. The fin structure extends in a first direction in plan view. An isolation insulating layer is formed over the substrate so that a lower portion of the fin structure is embedded in the isolation insulating layer and an upper portion of the fin structure is exposed from the isolation insulating layer. A gate structure is formed over a part of the fin structure. The gate structure includes a gate electrode and a gate dielectric layer, and extends in a second direction crossing the first direction in plan view. An upper portion of the fin structure not covered by the gate structure is recessed. An epitaxial structure is formed over the recessed fin structure. A silicide layer is formed over at least a part of the epitaxial structure. The epitaxial structure includes an n-type semiconductor layer formed over the recessed fin structure and a $Si_{1-x}Ge_x$ layer doped with phosphorous formed over the n-type semiconductor layer. In the forming the silicide layer, a Ti layer is formed over the $Si_{1-x}Ge_x$ layer, and a thermal process is performed to form an alloy of Ti, Si and Ge. The n-type semiconductor layer is a SiP layer.

In accordance with another aspect of the present disclosure, an n-channel semiconductor field effect transistor comprises an isolation insulating layer, a fin structure, a gate structure and a source/drain structure. The isolation insulating layer is disposed over a substrate. The fin structure is disposed over the substrate, and extends in a first direction in plan view. An upper portion of the fin structure is exposed from the isolation insulating layer. The gate structure is disposed over a part of the fin structure, and extends in a second direction crossing the first direction. The source/drain structure is disposed on the upper portion of the fin structure, which is not covered by the gate structure and exposed from the isolation insulating layer. The source/drain structure includes a SiP layer, and an upper portion of the source/drain structure includes an alloy layer of Si, Ge and Ti.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a fin field effect transistor (FinFET), the method comprising:
   forming a fin structure over a substrate, the fin structure extending in a first direction in plan view;
   forming an isolation insulating layer over the substrate so that a lower portion of the fin structure is embedded in the isolation insulating layer and an upper portion of the fin structure is exposed from the isolation insulating layer;
   forming a gate structure over a part of the fin structure, the gate structure including a gate electrode and a gate dielectric layer, the gate structure extending in a second direction crossing the first direction in plan view;
   recessing an upper portion of the fin structure not covered by the gate structure below an upper surface of the isolation insulating layer;
   forming an epitaxial structure over the recessed fin structure;
   forming a silicide layer over at least a part of the epitaxial structure; and
   forming a contact plug, wherein:
   the epitaxial structure includes an n-type semiconductor layer formed over the recessed fin structure and a $Si_{1-x}Ge_x$ layer doped with phosphorous formed over the n-type semiconductor layer,
   the forming the silicide layer includes:
      forming a Ti layer over the $Si_{1-x}Ge_x$ layer; and
      performing a thermal process to form an alloy of Ti, Si and Ge,
   the Ti layer is fully consumed to form the alloy layer by the thermal operation or a remaining Ti layer is removed after the thermal operation so that the contact plug is in direct contact with the silicide layer,
   the n-type semiconductor layer includes a first SiP layer formed on the recessed fin structure and a second SiP layer formed directly on the first SiP layer,
   a concentration of phosphorous in the first SiP layer is smaller than a concentration of phosphorous in the second SiP layer,
   a depth of the second SiP layer from an interface between the epitaxial structure and the $Si_{1-x}Ge_x$ layer is in a range from 30 nm to 60 nm,
   the concentration of phosphorous in the first SiP layer is in a range from $2 \times 10^{20}$ atoms $cm^{-3}$ to $7 \times 10^{21}$ atoms $cm^{-3}$, and
   the concentration of phosphorous in the second SiP layer is in a range from $3 \times 10^{20}$ atoms $cm^{-3}$ to $4 \times 10^{21}$ atoms $cm^{-3}$.

2. The method of claim 1, wherein x in the $Si_{1-x}Ge_x$ layer is in a range from 0.25 to 0.4.

3. The method of claim 1, wherein a concentration of phosphorus in the $Si_{1-x}Ge_x$ layer is in a range from $1 \times 10^{20}$ atoms $cm^{-3}$ to $5 \times 10^{21}$ atoms $cm^{-3}$.

4. The method of claim 1, further comprising:
   after forming the silicide layer, forming one or more interlayer dielectric layers;
   opening the one or more interlayer dielectric layers to form a contact hole; and
   forming the contact plug in direct contact with the silicide layer in the contact hole.

5. The method of claim 1, further comprising:
   after forming the epitaxial structure and before forming the silicide layer, forming one or more interlayer dielectric layers;

opening the one or more interlayer dielectric layers to form a contact hole, thereby exposing a part of the epitaxial structure; and forming the contact plug in direct contact with the silicide layer in the contact hole, wherein the silicide layer is formed after the opening the one or more interlayer dielectric layers.

6. A method of manufacturing a semiconductor device including a fin field effect transistor (FinFET), the method comprising:

forming a gate structure over a part of a fin structure;

recessing an upper portion of the fin structure not covered by the gate structure;

forming an epitaxial structure over the recessed fin structure, the epitaxial structure including an n-type semiconductor layer;

forming a first layer containing a $Si_{1-x}Ge_x$ layer doped with phosphorous over the n-type semiconductor layer;

forming a metal layer containing a metal material over the first layer;

performing a thermal process to form an alloy layer including Si, Ge and the metal material;

after the alloy layer is formed, forming one or more interlayer dielectric layers;

opening the one or more interlayer dielectric layers to form a contact hole; and forming a contact plug in contact with the alloy layer in the contact hole, wherein:

the epitaxial structure includes a first SiP layer formed directly on the recessed fin structure and a second SiP layer formed directly on the first SiP layer, a concentration of phosphorous in the first SiP layer is different from a concentration of phosphorous in the second SiP layer, and the first SiP layer and the second SiP layer directly contact the $Si_{1-x}Ge_x$ layer.

7. The method of claim 6, wherein the metal material is Ti.

8. The method of claim 6, wherein the n-type semiconductor layer is a SiP layer, and a concentration of phosphorous in the SiP layer is in a range from $1\times10^{20}$ atoms $cm^{-3}$ to $5\times10^{21}$ atoms $cm^{-3}$.

9. The method of claim 8, wherein the SiP layer includes two or more continuously formed SiP layers with a different phosphorous concentration from each other.

10. The method of claim 8, wherein x in the $Si_{1-x}Ge_x$ layer is in a range from 0.25 to 0.5.

11. The method of claim 8, wherein a concentration of phosphorus in the $Si_{1-x}Ge_x$ layer is in a range from $1\times10^{20}$ atoms $cm^{-3}$ to $5\times10^{21}$ atoms $cm^{-3}$.

12. The method of claim 6, wherein the thermal process is performed at a temperature of 500° C. to 1100° C.

13. The method of claim 6, wherein the thermal process is performed for a time period of 1 μsec to 1 sec.

14. The method of claim 6, wherein by the thermal process, all of the $Si_{1-x}Ge_x$ layer is converted to the alloy layer.

15. A method of manufacturing a semiconductor device including a fin field effect transistor (FinFET), the method comprising:

forming a gate structure over part of fin structures protruding an isolation insulating layer;

forming a fin mask layer over the fin structures and the isolation insulating layer;

recessing upper portions of the fin structures not covered by the gate structure such that part of the fin mask layer continuously remains on the isolation insulating layer between the fin structures;

forming an epitaxial source/drain structure over each of the recessed fin structures, the epitaxial source/drain structure including an n-type semiconductor layer;

epitaxially forming a first layer containing a $Si_{1-x}Ge_x$ layer doped with phosphorous over the n-type semiconductor layer of the epitaxial source/drain structure of each of the fin structures;

forming a metal layer containing a metal material over the first layer; and performing a thermal process to form an alloy layer including Si, Ge and the metal material, wherein:

by the thermal process, all of the $Si_{1-x}Ge_x$ layer disposed on the epitaxial source/drain structure of at least one of the fin structures is converted to the alloy layer, the alloy layer is in contact with the remaining fin mask layer, the epitaxial source/drain structure is a merged epitaxial structure common to the fin structures, the epitaxial source/drain structure includes a first SiP layer formed on the recessed fin structures, respectively and a second SiP layer, which is a merged structure, formed directly on the first SiP layer, and a concentration of phosphorous in the first SiP layer is different from a concentration of phosphorous in the second SiP layer.

16. The method of claim 15, wherein:

a concentration of phosphorus in the $Si_{1-x}Ge_x$ layer is in a range from $1\times10^{20}$ atoms $cm^{-3}$ to $5\times10^{21}$ atoms $cm^{-3}$.

17. The method of claim 15, wherein only a part of the $Si_{1-x}Ge_x$ layer disposed on the epitaxial source/drain structure of another one of the fin structures is converted to the alloy layer.

18. The method of claim 15, wherein the metal material is Ti.

* * * * *